United States Patent
Sanfilippo et al.

(10) Patent No.: US 6,331,470 B1
(45) Date of Patent: Dec. 18, 2001

(54) PROCESS FOR MANUFACTURING A SEMICONDUCTOR MATERIAL WAFER HAVING POWER REGIONS DIELECTRICALLY INSULATED FROM CIRCUITRY REGIONS

(75) Inventors: Delfo Sanfilippo, Catania; Salvatore Leonardi, Aci Sant'Antonio, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/580,364

(22) Filed: May 26, 2000

(51) Int. Cl.[7] .................................................. H01L 21/331
(52) U.S. Cl. ...................... 438/311; 438/410; 438/413; 438/355; 438/362; 438/363; 438/443
(58) Field of Search ..................................... 438/404, 410, 438/413, 311, 355, 362, 363, 443, 442

(56) References Cited

U.S. PATENT DOCUMENTS 5,087,580 * 2/1992 Eklund .

| | | | |
|---|---|---|---|
| 5,904,535 | * | 5/1999 | Lee ........................................ 438/355 |
| 5,909,626 | * | 6/1999 | Kobayashi ............................ 438/404 |
| 5,930,648 | * | 7/1999 | Yang ...................................... 438/443 |
| 6,214,694 | * | 4/2001 | Leobandung et al. ................ 438/413 |

OTHER PUBLICATIONS

Sugawara, Y., "Large Electric Power Capability Techniques for DI–PICs," *Dielectric Isolation Technologies and Power Ics,* pp. 150–157.

* cited by examiner

*Primary Examiner*—Trung Dang
(74) *Attorney, Agent, or Firm*—Theodore E. Galanthay; Charles J. Rupnick; Seed IP Law Group PLLC

(57) ABSTRACT

A manufacturing process is carried out starting from an SOI type wafer including a top silicon layer and a bottom silicon layer separated from each other by a buried silicon dioxide layer. In the top layer, a LOCOS type sacrificial region is formed and then removed, so as to form a cavity that extends in depth as far as the buried oxide layer. Subsequently, the cavity is filled with epitaxial or polycrystalline silicon, so as to form a power region extending between the top surface and the bottom surface of the wafer; then lateral insulation regions are formed that insulate the power region from the circuitry region.

22 Claims, 5 Drawing Sheets

PROCESS FOR MANUFACTURING A SEMICONDUCTOR MATERIAL WAFER HAVING POWER REGIONS DIELECTRICALLY INSULATED FROM CIRCUITRY REGIONS

TECHNICAL FIELD

The present invention refers to a process for manufacturing a semiconductor material wafer comprising power regions dielectrically insulated from circuitry regions.

BACKGROUND OF THE INVENTION

As is known, integration of low voltage devices and power devices on a same silicon wafer requires particular isolation structures. For example, power devices with vertical current flow need the capability of withstanding high voltages and currents and of low voltage control components in a same chip. In this case, it is necessary to form, in the wafer, wells that are dielectrically insulated and that house the control components, whilst in the intermediate regions the silicon extends with continuity between the two faces of the wafer and houses the power devices.

One solution for forming such a structure is proposed in Y. Sugawara "Dielectric Isolation Technologies and Power Integrated Circuits", pp. 150–157, in B. Murari, F. Bertotti, G. A. Vignola "Smart Power ICs—Technologies and Applications", Springer, 1995. According to this article, the process starts from a SOI (Silicon-On-Insulator) type substrate comprising a bottom silicon layer and a top silicon layer separated by a silicon dioxide layer. Next, portions of the top silicon layer and of the silicon dioxide layer are etched in the areas where the power devices are to be formed. An epitaxial growth is then carried out, and the surface of the wafer is planarized. The structure that is obtained in this way comprises portions having the bottom layer and the top layer separated by buried oxide regions and portions of silicon continuity, in which the epitaxial layer interfaces directly with the bottom layer. Finally, the portions overlying the buried oxide islands are insulated by trenches filled with dielectric material and undergo standard fabrication steps to form the low voltage circuitry, whilst the vertical current flow power devices are formed in the portions of silicon continuity.

The described process presents some drawbacks. Mainly, direct etching of silicon to remove extensive portions of the top silicon layer creates problems. In fact, a dry etch enables only removal of limited portions of silicon, corresponding to approximately 5–10% of the surface of the wafer, whereas to form power devices it is necessary to remove silicon areas corresponding to 50–70% of the wafer surface. Furthermore, a dry etch may easily cause crystallographic damage to the substrate that cannot be eliminated with subsequent treatments. This is particularly disadvantageous in the manufacture of devices using the so-called "Smart Power" technology, because in this case the quality of the silicon is an essential requisite for achieving high levels of performance of the low voltage components.

A wet etch, on the other hand, enables removal of extensive silicon portions, but entails in any case a non-negligible risk of causing crystallographic damage. In addition, wet etching of silicon is a costly process, in so far as it is at present not exploited to any great extent in the industrial field and involves the use of equipment that is not readily available on the market, as well as careful setting up from the chemical standpoint.

More in general, neither of the solutions is very economic, in that they present a very low yield and are not suited for being employed on a large scale.

SUMMARY OF THE INVENTION

The disclosed embodiments of the present invention provide a process for manufacturing structures of the type specified above that is free from the drawbacks described and, in particular, enables a high yield and is economic.

According to the present invention, a process is therefore provided for manufacturing a semiconductor material wafer, including forming a starting wafer having a bottom layer and a top layer, both of semiconductor material, and a buried layer of dielectric material arranged between the bottom layer and the top layer; removing portions of the top layer and forming cavities extending in depth as far as the buried layer, comprising forming sacrificial regions by oxidizing the top layer and removing the sacrificial regions; removing portions of the buried layer beneath the cavity; filling the cavities with filling regions of semiconductor material; and forming lateral insulation regions between the filling regions and circuitry regions in the top layer.

BRIEF DESCRIPTION OF THE DRAWINGS

For a better understanding of the present invention, embodiments thereof are described hereinafter as non-limiting examples, with reference to the attached drawings, wherein.

DETAILED DESCRIPTION OF THE INVENTION

FIGS. 1a–1h illustrate an embodiment of the present process for obtaining a vertical current flow bipolar power transistor insulated by two semiconductor material wells wherein electronic control components may be integrated.

Figure 1A:
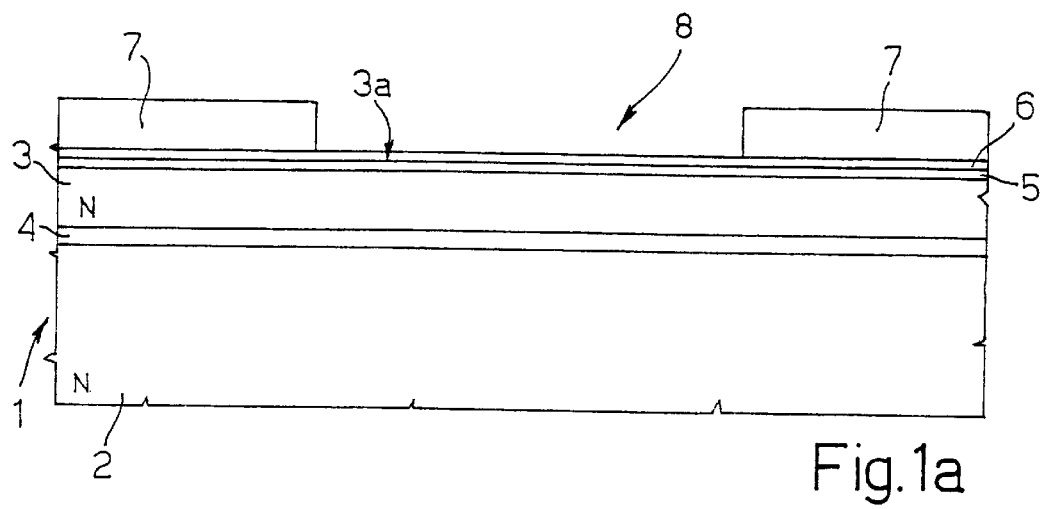
FIGS. 1a–1h show cross sections through a wafer manufactured according to the present process, in successive processing steps.

As shown in FIG. 1a, the present process starts from an SOI type wafer 1 comprising a bottom layer 2 and a top layer 3, both the layers being made of N-type monocrystalline silicon and being separated from one another by a buried silicon dioxide layer 4. The top layer 3 has a thickness not exceeding 2 $\mu$m, and the buried oxide layer 4 preferably has a thickness of not less than 0.5 $\mu$m. The wafer 1 is obtained in a known way, not described in detail herein, for example using the SIMOX (Separation by IMplanted Oxygen) technique or the SDB (Silicon Direct Bonding) technique.

According to the invention, in the top layer 3, a sacrificial silicon dioxide region 10 formed, using the known LOCOS (Local Oxidation of Silicon) technique, in the area where the power device is to be formed.

For this purpose, on the surface 3a of the top layer 3, a first protective oxide layer 5 is grown and, subsequently, a first silicon nitride layer 6 is deposited. A first resist LOCOS mask 7 is then formed, which covers the entire surface 3a, except for an opening 8 in an area corresponding to the portion where the power device is to be formed; the structure shown in FIG. 1a is thus obtained.

Subsequently, the first nitride layer 6 and the first protective oxide layer 5 are selectively etched at the opening 8. Then the first LOCOS mask 7 is removed.

Figure 1B:
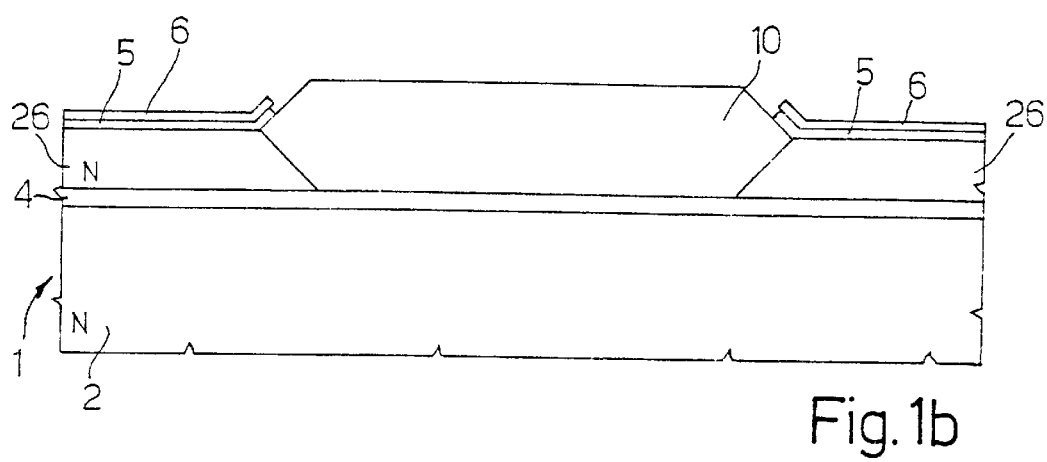

Subsequently, as shown in FIG. 1b, a thermal oxidation is carried out, whereby the silicon of the top layer 3 is oxidized, where it is exposed, to form a sacrificial region 10 which extends in depth until it reaches the buried oxide layer 4. The remaining portion of the top layer 3 is hereinafter referred to as the "circuitry region" 26.

Figure 1C:
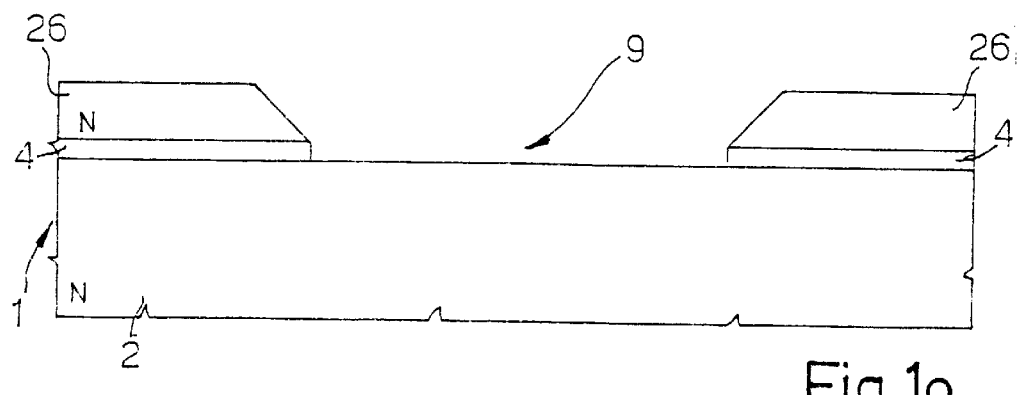

Next, as shown in FIG. 1c, the sacrificial oxide region 10 is removed by wet etching, followed by a dry etch to remove anisotropically the portion of the buried oxide layer 4 underlying the sacrificial oxide layer. In this way, a cavity 9 is present in the circuitry region 26, and the bottom layer 2 is uncovered in an area corresponding to the cavity 9.

In the embodiment shown, specific manufacturing steps are then carried out to form a bipolar transistor. For this purpose, a pre-implant oxide layer 12 is grown (FIG. 1d), for example having a thickness of between 100 and 300 Å, and an implant mask 15 is formed and covers the entire surface of the wafer 1, except for the area corresponding to the cavity 9. A P-type dopant ionic species, schematically represented by the arrows 13, is implanted and then, using a thermal process, is diffused in the bottom layer 2 to form a P-type buried region 100a.

Figure 1D:
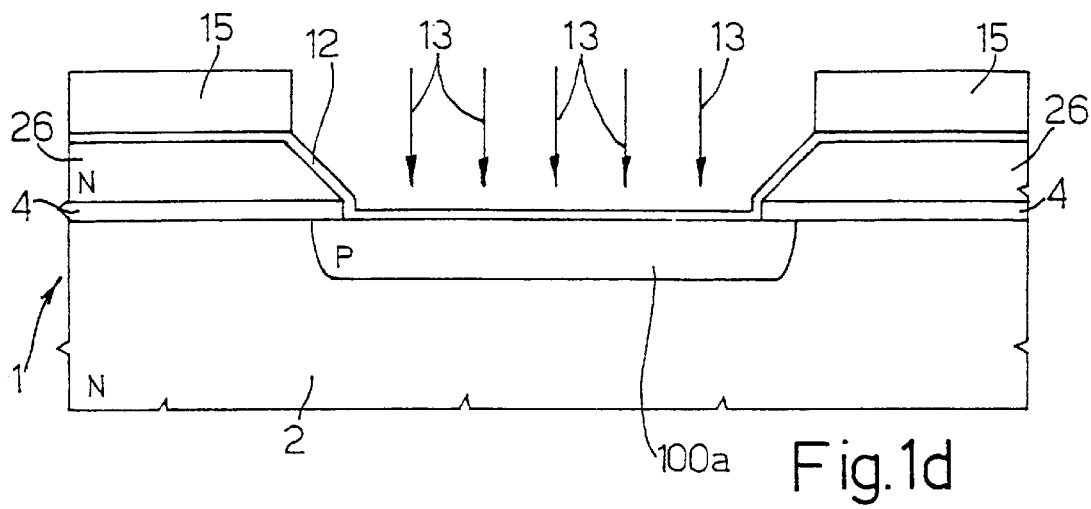
Figure 1E:
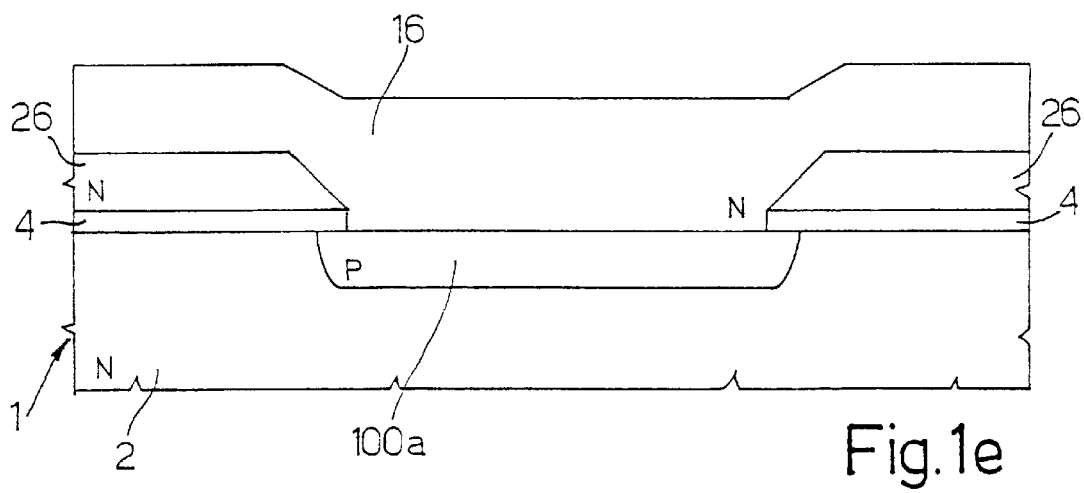
Figure 1F:
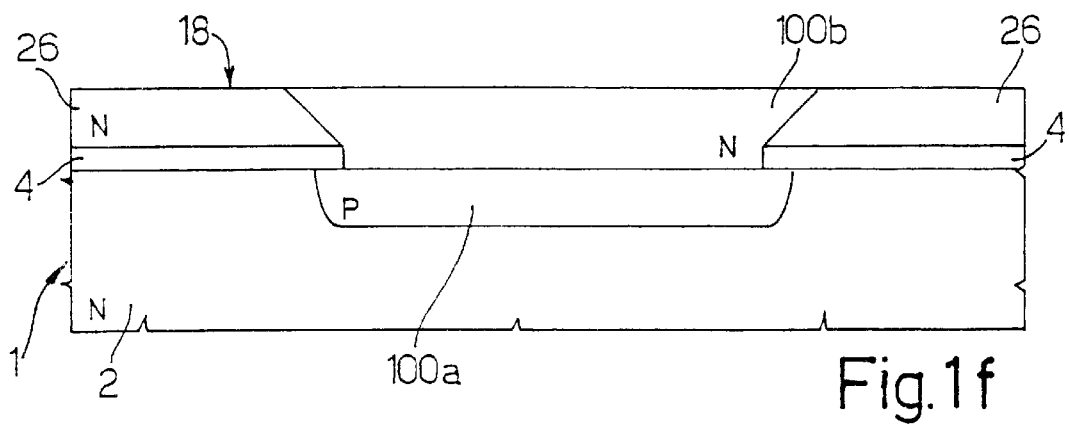
Figure 1G:
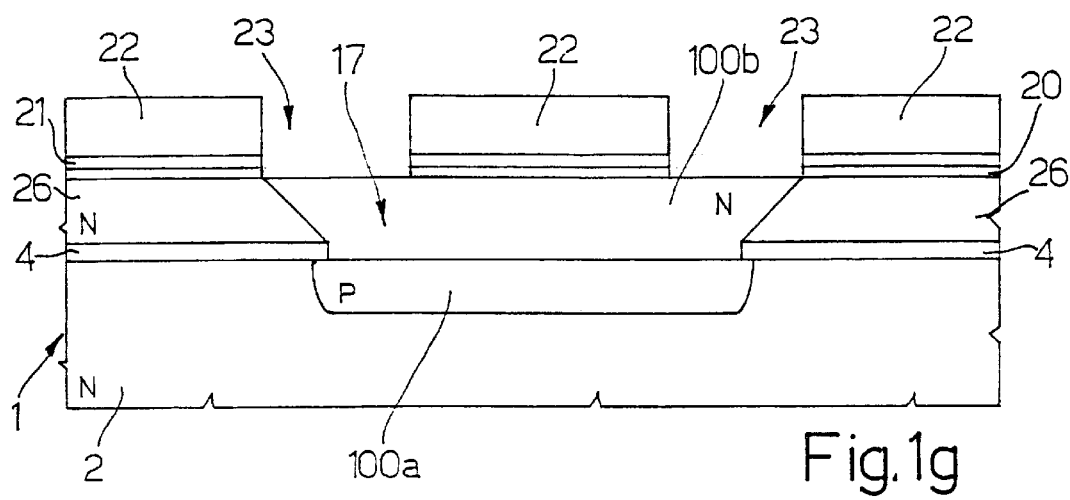

Next, the implant mask 15 and the pre-implant oxide layer 12 are removed. A polycrystalline silicon layer 16 sufficiently thick to fill the cavity 9 is then deposited on the wafer 1 (FIG. 1e).

Next (FIG. 1f), the polycrystalline silicon layer 16 is doped with an N-type doping species, and the wafer 1 is planarized, for example using a chemomechanical process (CMP etching). The polycrystalline silicon layer 16 is thus removed, except for only one portion, a filling region 100b surrounded by the circuitry region 26 and defining, together with the latter, a top surface 18. At this stage of the process, the wafer 1 comprises a power portion 17 including the filling region 100b and the bottom layer 2 (including the P-type buried region 100a), the portion 17 extending, without interruptions, between the upper face 18 and the lower face (not shown) of the wafer 1.

Subsequently, the LOCOS technique is again used to dielectrically insulate the filling region 100b from the circuitry region 26. In detail (FIG. 1g), a second protective oxide layer 20 is grown on the wafer 1, and next a second silicon nitride layer 21 is deposited. A second LOCOS mask 22 is then formed, and covers the entire surface of the wafer 1, except for an opening 23. Portions of the second silicon nitride layer 21 and of the second protective oxide layer 20 beneath the opening 23 are then removed, and the second LOCOS mask 22 is removed.

A thermal oxidation is then carried out, thereby the silicon of the circuitry region 26 is converted into silicon dioxide, giving rise to lateral insulation regions 25, which extend in depth as far as the buried oxide layer 4 (FIG. 1h) and separate the power portion 17 from the circuitry region 26.

Figure 1H:
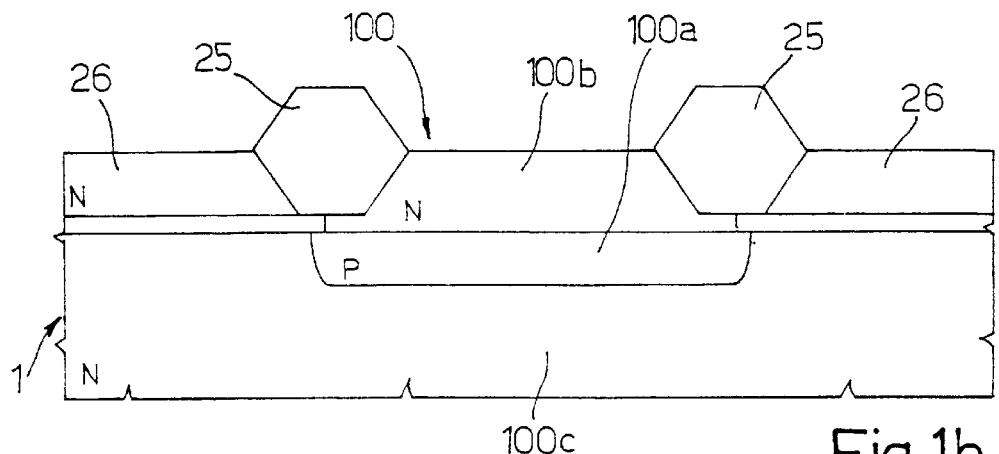

After removing the remaining portions of silicon nitride and protective oxide, the structure of FIG. 1h is obtained, wherein the power portion 17 forms a transistor 100, and precisely the bottom layer 2 forms a collector, the P-type buried region 100a forms a base, and the filling region 100b forms an emitter. The wafer finally undergoes further manufacture steps to obtain the components of the circuitry in the circuitry region 26 and to form electrical connections between the components.

FIGS. 2a–2f, in which parts corresponding to those shown in FIGS. 1a–1h are indicated by the same reference numbers, illustrate a second embodiment of the process according to the present invention. The second embodiment may be advantageously adopted in the case of SOI type silicon wafers having a top layer 3 that is thicker than the field oxide layers obtainable with the LOCOS technique, and involves repeated execution of the steps of forming sacrificial oxide regions obtained using the LOCOS technique and removing them.

Figure 2A:
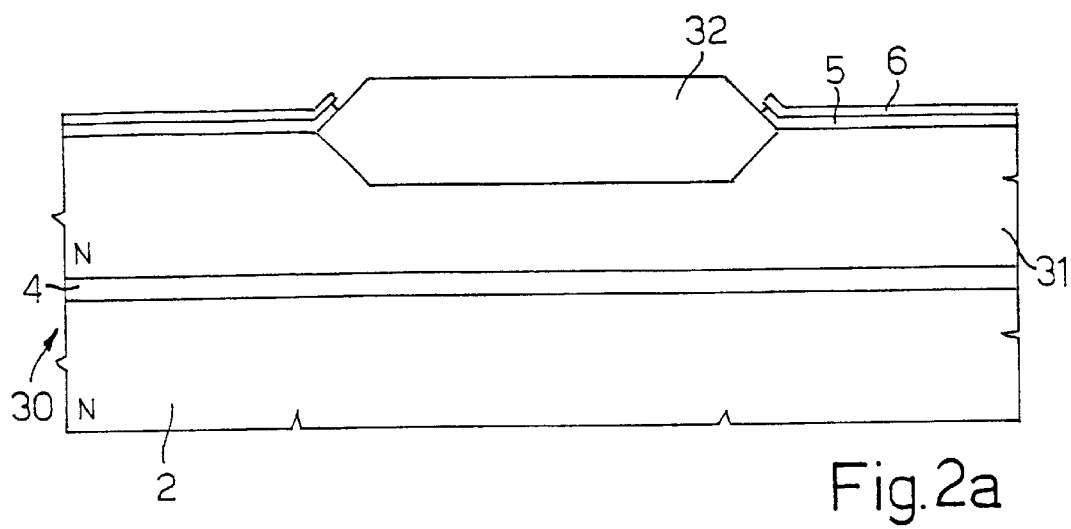
FIGS. 2a–2f are cross sections through a wafer manufactured according to the present process, in a different embodiment, in successive processing steps.

With reference to FIG. 2a, an SOI type silicon wafer 30 comprises a bottom layer 2 and a buried silicon dioxide layer 4 like the ones shown in FIG. 1a. The wafer 30 further comprises a top layer 31 having a thickness of more than 2 μm (for example, 4 μm). The bottom layer 2 and the top layer 31 are N-type layers.

Initially, steps similar to the ones described with reference to FIGS. 1a and 1b are carried out, except that a first sacrificial oxide region 32 is formed, which has a thickness smaller than the thickness of the top layer 31. In this case, in fact, it is not possible to oxidize the top layer 31 down to the buried oxide layer 4 since the limits of current technology do not allow silicon dioxide regions greater than 2 μm in thickness to be obtained using the LOCOS technique.

Figure 2B:
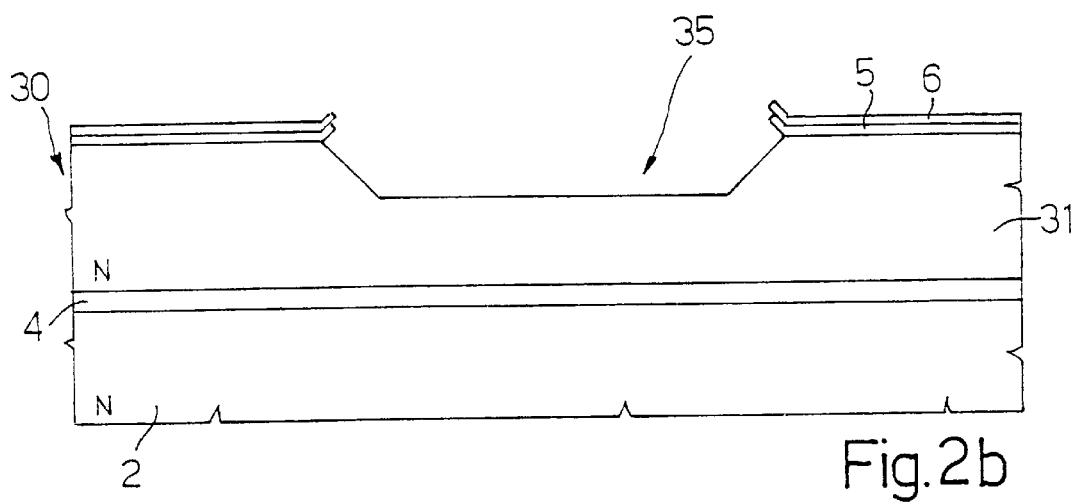

The first sacrificial oxide region 32 is etched and removed, for instance, by wet etching, so as to obtain a first cavity 35 (FIG. 2b).

Figure 2C:
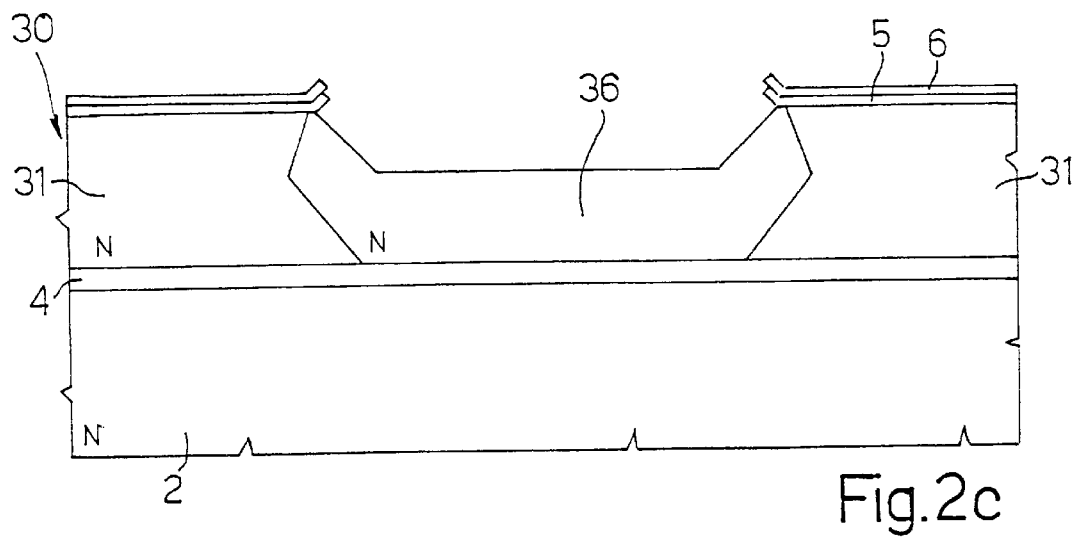
Figure 2D:
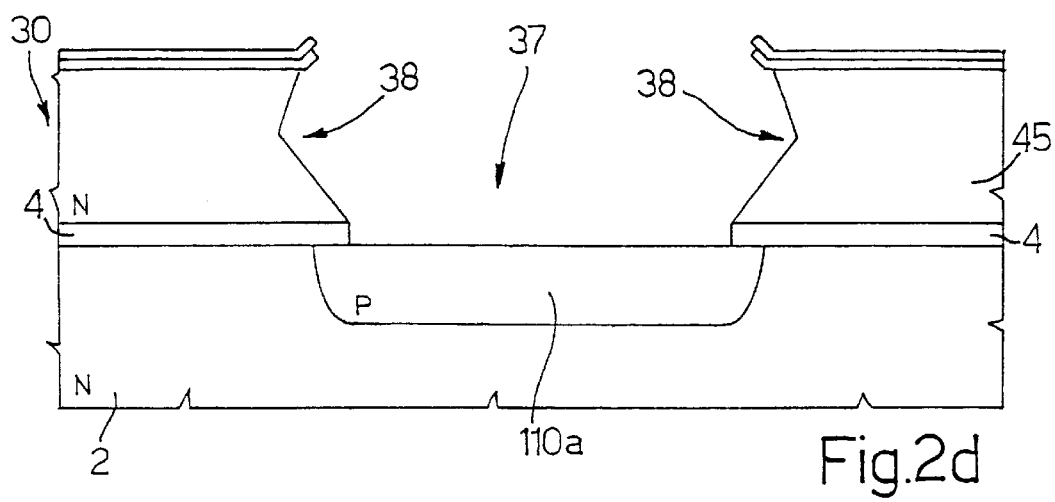

Subsequently, the steps of thermal oxidation and removal of the silicon dioxide region by wet etching are repeated one or more times (as illustrated in FIG. 2c, where a second sacrificial oxide region 36 is shown) until a second cavity 37 is formed, which has a depth such as to reach the buried oxide layer 4 (FIG. 2d). The remaining portion of the top layer 31 forms a circuitry region 45. Then, the uncovered portion of the buried oxide layer 4 is removed, as was previously described with reference to FIG. 1c.

Subsequently, a P-type buried region 110a is formed by implantation and subsequent diffusion of doping ionic species, according to the above description made with reference to FIG. 1d.

Figure 2E:
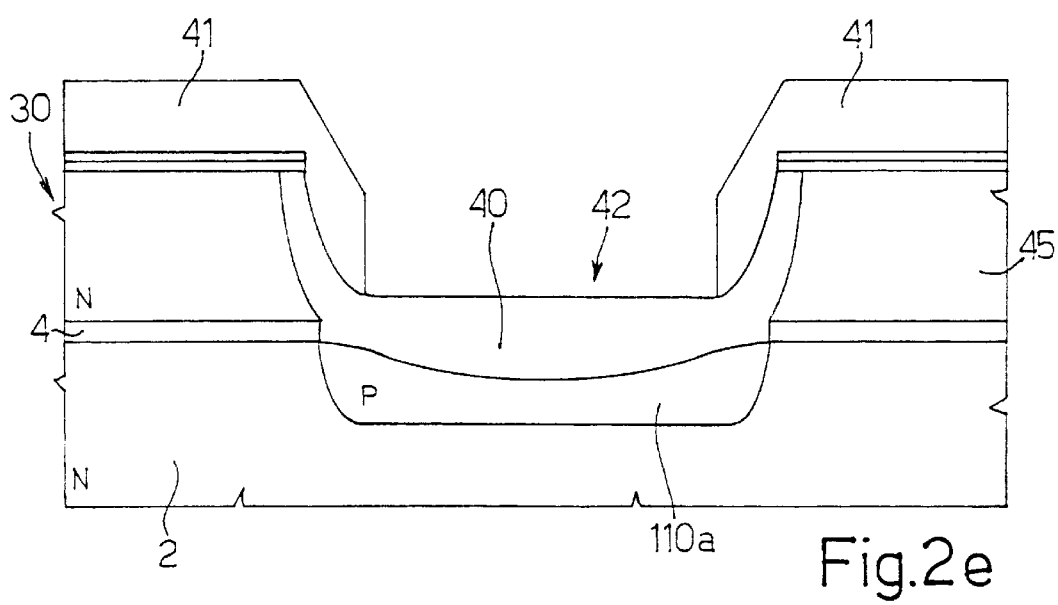
Figure 2F:
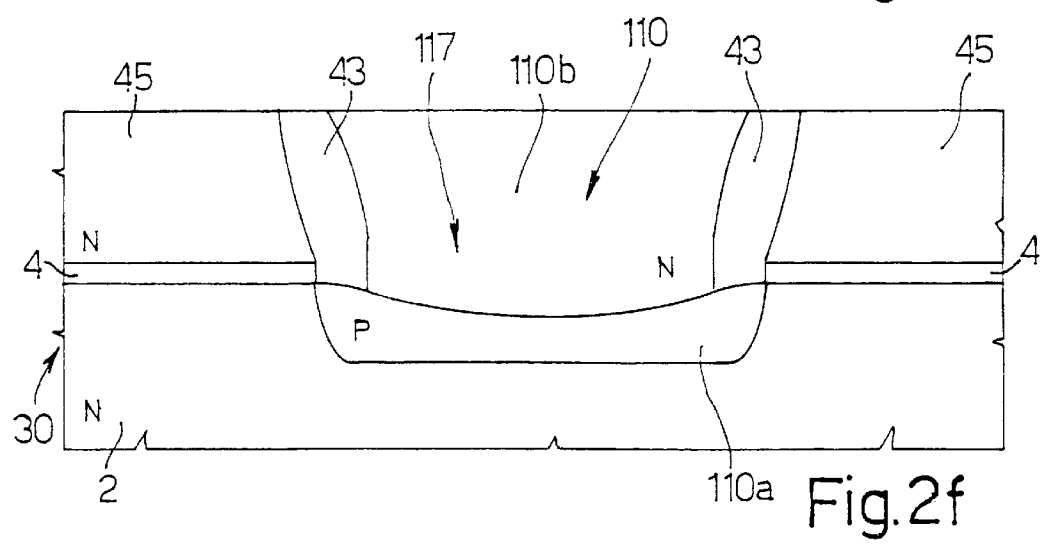

During a further oxidation step, walls 38 of the cavity 37 and of the P-type buried region 110a are coated with silicon dioxide to form a lateral insulation layer 40, as shown in FIG. 2e. For example, the lateral insulation layer 40 may be grown thermally; alternatively, it may be deposited. A lateral insulation mask 41 is then formed, which has an opening 42 in an area corresponding to the P-type buried region 110a. The uncovered portions of the lateral insulation layer 40 are then etched and removed, leaving lateral insulation regions 43 on the sides of the cavity 37 (FIG. 2f).

Subsequently, the second cavity 37 is filled by growing an epitaxial layer or by depositing polycrystalline silicon so as to form a filling region 110b. The structure is finally planarized (FIG. 2f), as has already been described with reference to FIGS. 1e and 1f. As in the previous case, a power portion 117 is thus formed housing a bipolar transistor 110 comprising the bottom layer 2 (forming a collector), the P-type buried region 110a (forming a base), and the filling region 110b (forming an emitter).

Finally, in a per se known manner and thus not described herein, the low power components and the electrical connections are formed.

The advantages of the present invention include the following.

First, the described process enables removing vast silicon portions without resorting to direct etching of silicon. Thereby, the risk of producing crystallographic defects such as might jeopardize the performance of the devices is considerably reduced. In addition, the techniques used in the process, in particular the LOCOS type oxidation and the oxide etching, are of widespread application in electronics, easy to control and inexpensive. Consequently, the process enables a high yield and proves advantageous from the economic standpoint, as well as usable on a large scale.

In addition, the process can be advantageously used for the fabrication of integrated circuits with "Smart Power" technology, which, as mentioned previously, enables high performance features to be achieved.

Finally, it is clear that modifications and variations may be made to the process described herein without thereby departing from the scope of the present invention.

Figure 3:
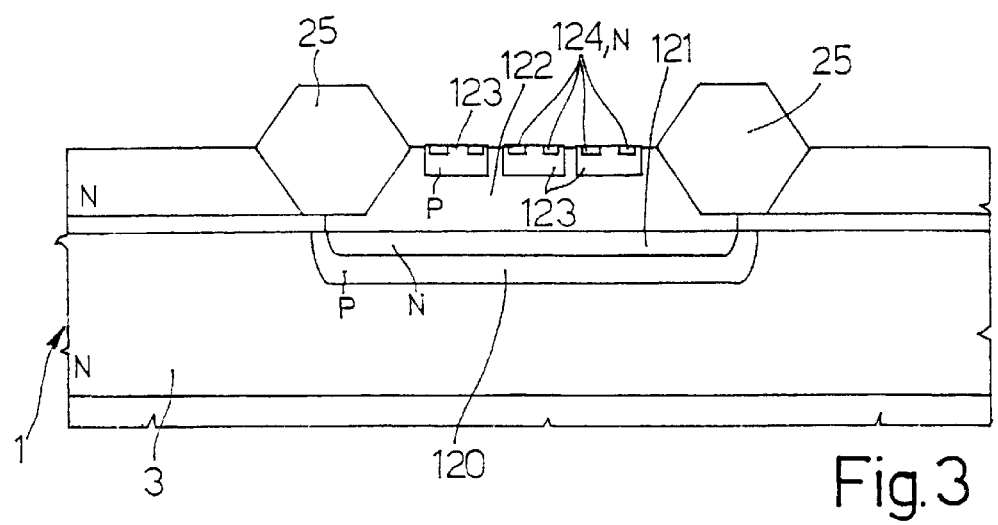
FIG. 3 shows a device that may be obtained with the process according to the invention.

For example, power devices other than the bipolar transistors described herein may be formed, for instance MOS type transistors or mixed MOS/bipolar type transistors. In particular, FIG. 3 shows a component of the mixed MOS/bipolar type. Specifically, the bottom N-type layer 2 forms the collector of a bipolar transistor and houses a P-type base region 120 surrounding an N-type emitter region 121. The filling region 122, also of the N type, forms the drain of a vertical current flow power MOS transistor and houses P-type body regions 123 which in turn house N-type source regions 124. The base region 120 and the emitter region 121 are obtained through two successive implantations using doping species of different types and an appropriate implantation energy in a per se known manner, prior to forming the filling region 122.

In addition, filling of the cavities formed by etching the sacrificial oxide regions may be performed not only by deposition of polycrystalline silicon, but also by epitaxially growing monocrystalline silicon according to the type of power component that it is intended to form. Advantageously, in the case of epitaxial growth, possible polycrystalline regions or regions presenting crystallographic defects caused by the edges of the buried oxide layer 4 can be eliminated by growing lateral insulation oxide regions 25 of appropriate width.

Finally, during the formation of the lateral insulation regions 25, further insulation regions may be formed within the circuitry region 26 so as to form one or more wells that are dielectrically isolated from one another and from the power portion 17.

While preferred embodiments of the invention have been illustrated and described, it is to be understood that various changes may be made therein without departing from the spirit and scope of the invention. Hence, the invention is to be limited only by the scope of the claims that follow and the equivalents thereof.

What is claimed is:

1. A process for manufacturing a wafer of semiconductor material, including a power region and a circuitry region insulated from each other by dielectric material, the process comprising:

forming a starting wafer having a bottom layer, a top layer, both of semiconductor material, and a buried layer of dielectric material, arranged between said bottom layer and said top layer;

removing portions of said top layer and forming cavities extending in depth as far as said buried layer, comprising forming sacrificial regions by oxidizing said top layer; and removing said sacrificial regions;

removing portions of said buried layer beneath said cavities;

filling said cavities with filling regions of semiconductor material; and forming lateral insulation regions between said filling regions and circuitry regions in said top layer.

2. The process of claim 1 wherein forming sacrificial regions comprises locally oxidizing said portions of said top layer.

3. The process of claim 1 wherein said sacrificial regions extend in depth down to said buried layer.

4. The process of claim 1 wherein forming sacrificial regions and removing said sacrificial regions are repeated in sequence until said buried region is reached.

5. The process of claim 1 wherein forming lateral isolation regions comprises locally oxidizing interface portions between said filling regions and said circuitry regions.

6. The process of claim 1 wherein forming lateral isolation regions comprises oxidizing walls of said cavities before filling said cavities.

7. The process of claim 1 wherein filling said cavities comprises epitaxially growing a monocrystalline silicon layer.

8. The process of claim 1 wherein filling said cavities comprises depositing a polycrystalline silicon layer.

9. A manufacturing process for integrated circuits formed on a Silicon-On-Insulator wafer, the process comprising:

forming a sacrificial region on a top layer of the wafer;

removing the sacrificial region to form a cavity in the top layer that extends at least to a buried dielectric layer;

filing the cavity with a semiconductor filling material; and forming a lateral insulation region between the semiconductor filling material and the top layer.

10. The process of claim 9 wherein forming the sacrificial region on the top layer comprises locally oxidizing portions of the top layer.

11. The process of claim 9 wherein the sacrificial region is formed in the top layer to a depth extending down to the buried dielectric layer.

12. The process of claim 9 wherein removing the sacrificial region includes removing a portion of the buried dielectric layer.

13. The process of claim 9 wherein forming the lateral insulation region comprises locally oxidizing interface portions between the semiconductor filling material and the top layer.

14. The process of claim 9 wherein filling the cavity comprises epitaxially growing a monocrystalline silicon layer.

15. The process of claim 9 wherein filling the cavity comprises depositing a polycrystalline silicon layer.

16. A manufacturing process for integrated circuits formed on a Silicon-On-Insulator wafer, the process comprising:

forming a sacrificial region on a top layer of the wafer;

removing the sacrificial region to form a cavity in the top layer that extends at least to a buried dielectric layer;

electrically insulating walls of the cavity; and filling the cavity with a semiconductor filling material.

17. The process of claim 16 wherein forming the sacrificial region comprises locally oxidizing portions of the top layer.

18. The process of claim 16 wherein the sacrificial region is formed to extend at least down to the depth of the buried dielectric layer.

19. The process of claim 16 wherein removing the sacrificial region comprises removing at least a portion of the buried dielectric layer.

20. The process of claim 16 wherein electrically insulating walls of the cavity comprises oxidizing the walls of the cavity before filling the cavity with a semiconductor filling material.

21. The process of claim 20 wherein filling the cavity comprises epitaxially growing a monocrystalline silicon layer.

22. The process of claim 20 wherein filling the cavity comprises depositing a polycrystalline silicon layer.

* * * * *

UNITED STATES PATENT AND TRADEMARK OFFICE
CERTIFICATE OF CORRECTION

PATENT NO. : 6,331,470 B1  
DATED : December 18, 2001  
INVENTOR(S) : Delfo Sanfilippo et al.

It is certified that error appears in the above-identified patent and that said Letters Patent is hereby corrected as shown below:

<u>Title page,</u>
Item [30], Foreign Application Priority Data, should read as --
May 28, 1999 (IT)....... TO99A 000454 --.

Signed and Sealed this

Thirteenth Day of August, 2002

Attest:

JAMES E. ROGAN
*Attesting Officer*     *Director of the United States Patent and Trademark Office*